United States Patent [19]

Ishigaki et al.

[11] Patent Number: 4,758,922

[45] Date of Patent: Jul. 19, 1988

[54] HIGH FREQUENCY CIRCUIT HAVING A MICROSTRIP RESONANCE ELEMENT

[75] Inventors: Isao Ishigaki, Sagamihara; Hiroyuki Yabuki, Kawasaki; Mitsuo Makimoto, Yokohama, all of Japan

[73] Assignee: Matsushita Electric Industrial Co., Ltd., Osaka, Japan

[21] Appl. No.: 121,259

[22] Filed: Nov. 16, 1987

[30] Foreign Application Priority Data

| Nov. 14, 1986 | [JP] | Japan | 61-272484 |
| Feb. 26, 1987 | [JP] | Japan | 62-43334 |
| Mar. 26, 1987 | [JP] | Japan | 62-72428 |
| Jun. 11, 1987 | [JP] | Japan | 62-145545 |

[51] Int. Cl.$^4$ .......................... H01G 1/00; H01G 4/10
[52] U.S. Cl. ..................................... 361/330; 361/321
[58] Field of Search ............... 361/328, 329, 330, 320, 361/321; 455/315, 316

[56] References Cited

U.S. PATENT DOCUMENTS

| 2,648,804 | 8/1953 | Steigerwalt et al. | 361/330 X |
| 2,777,110 | 1/1957 | Kodama | 361/328 X |
| 3,569,872 | 3/1971 | Berlin | 333/70 |
| 3,836,830 | 9/1974 | Akopian et al. | 361/330 |
| 4,424,615 | 1/1984 | Wakino | 361/321 X |
| 4,491,976 | 1/1985 | Saitoh et al. | 455/315 |

FOREIGN PATENT DOCUMENTS 61-159793  7/1986  Japan .

Primary Examiner—Donald A. Griffin
Attorney, Agent, or Firm—Pollock, Vande Sande & Priddy

[57] ABSTRACT

A miniaturized circuit for high frequency operation is formed of four successively superimposed dielectric layers, with a microstrip resonance element being sandwiched between two inner dielectric layers which themselves are sandwiched between opposing ground plane layers, and the other dielectric layers being respectively formed upon these ground plane layers. Circuit connection patterns are formed on the outer faces of the latter dielectric layers, and circuit components mounted thereon to form two circuit sections. The microstrip resonance element can be utilized as an inductive reactance element of an oscillator circuit, or as a filter circuit resonator element, and is effectively shielded by the ground plane layers which also effectively mutually isolate the two circuit sections.

12 Claims, 3 Drawing Sheets

HIGH FREQUENCY CIRCUIT HAVING A MICROSTRIP RESONANCE ELEMENT

BACKGROUND OF THE INVENTION

In recent years there has been an increasing requirement for greater compactness of various types of circuits for high frequency operation. Advances in semiconductor technology have made it possible to miniaturize the circuit elements, i.e. by utilizing integrated circuit techniques. In addition, various proposals have been made for improvements in the techniques for interconnecting and mounting the circuit components, with the objective of providing satisfactory performance when the overall circuit size is miniaturized, in spite of the fact that components are brought into close mutual proximity.

One such proposal is made for example in Japanese Patent Laid-open No. 61-159793. This describes a high frequency circuit which utilizes a multi-layer connecting lead substrate including a number of dielectric layers, with no substantial limitation being placed on the number of layers which can be incorporated. Due to considerations of the number of processing operations required during manufacture, reliability, and mechanical strength, all of the dielectric layers in the multi-layer connecting lead substrate of that prior art patent are made of identical thickness.

Such a multi-layer connecting lead substrate has component mounting patterns (i.e. patterns of connecting leads, component mounting pads, etc, formed from a layer of electrically conducting material) formed on the upper and lower external faces. In addition, other metallic layers are sandwiched between the dielectric layers, and may be formed into connecting lead patterns, which can be connected to patterns of other layers (i.e. via through-hole connections for example) to implement a 3-dimensional connecting lead system. Alternatively, such intermediate layers of electrically conducting material may be left in an unpatterned condition, and utilized for electrical shielding between other layers.

Due to the fact that a 3-dimensional connecting lead system can be formed in this way, and that shielding can be implemented between the layers, such a multi-layer connecting lead substrate can be utilized to form an extremely compact electric circuit, so that such multi-layer substrates have a very wide range of applicability. However a problem arises if a multi-layer connecting lead substrate having the configuration described above is used to implement a circuit for high frequency operation (e.g. for operation at frequencies in the region of several hundred MHz or higher) in which a microstrip (i.e. short length of strip conductor disposed above a ground plane layer, or between two ground plane layers), is utilized as a resonance element. As is well known, such a microstrip functions at a specific frequency as the equivalent of a series resonance circuit, and at a specific higher frequency functions as a parallel resonance circuit. Such resonance elements are utilized for example in high frequency oscillator or amplifier circuits. The problem which arises is that if such a microstrip resonance element is formed using a prior art type of multi-layer substrate, a substantially high level of electrical loss occurs for that element. Thus, the effective Q-factor of the microstrip resonator may be insufficiently high for desired circuit operation.

SUMMARY OF THE INVENTION

The present invention relates to a circuit for high frequency operation (referred to hereinafter simply as a high frequency circuit), typically for operation at frequencies in the region of several hundred MHz or more, formed with a multi-layer configuration and including a microstrip resonance element, whereby extreme compactness can be attained and moreover whereby a substantially lower level of loss can be attained for operation of the microstrip resonance element than has been possible in the prior art.

To achieve the above objectives, a high frequency circuit according to the present invention comprises at least first, second and third successively superimposed dielectric layers;

a microstrip resonance element formed by patterning a layer of electrically conducting material and sandwiched between the first and second dielectric layers;

a first ground plane layer comprising a layer of electrically conducting material formed over a lower face of the first dielectric layer and connected to a circuit ground potential;

a second ground plane layer comprising a layer of electrically conducting material formed sandwiched between the second and third dielectric layers and connected to the ground potential; and a circuit section comprising a circuit connection pattern formed of a layer of electrically conducting material disposed upon an upper face of the third dielectric layer and a plurality of circuit components mounted upon the circuit connection pattern.

Furthermore, in a high frequency circuit according to the present invention, at least one of the aformentioned first and second dielectric layers can be made of greater thickness than the third dielectric layer, to enable desired operating characteristics for the microstrip resonance element to be achieved.

Moreover, in a high frequency circuit according to the present invention, at least one of the aforementioned first and second dielectric layers can be formed of a material which exhibits a lower degree of electrical loss under high frequency operation than does the material forming the third dielectric layer, to thereby attain enhanced performance of the resonance element.

In addition, a high frequency circuit according to the present invention may include a through-aperture in the form of a slit, which extends through all of the aforementioned layers, in order to provide greater isolation between certain circuit portions.

DESCRIPTION OF THE PREFERRED EMBODIMENTS

Figure 1:
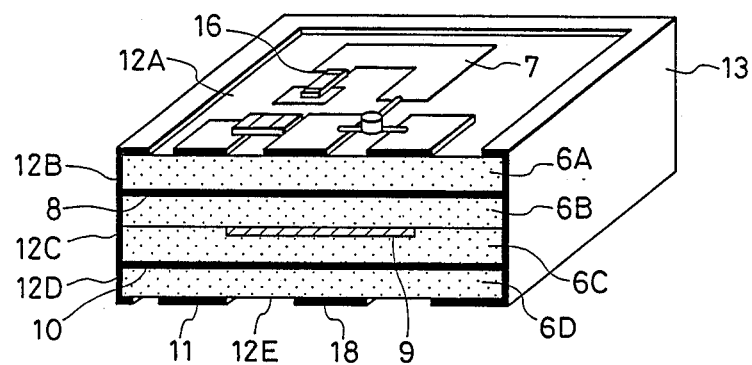
FIG. 1 is an oblique partially cut-away view of a first embodiment of a high frequency circuit according to the present invention.
Figure 2:
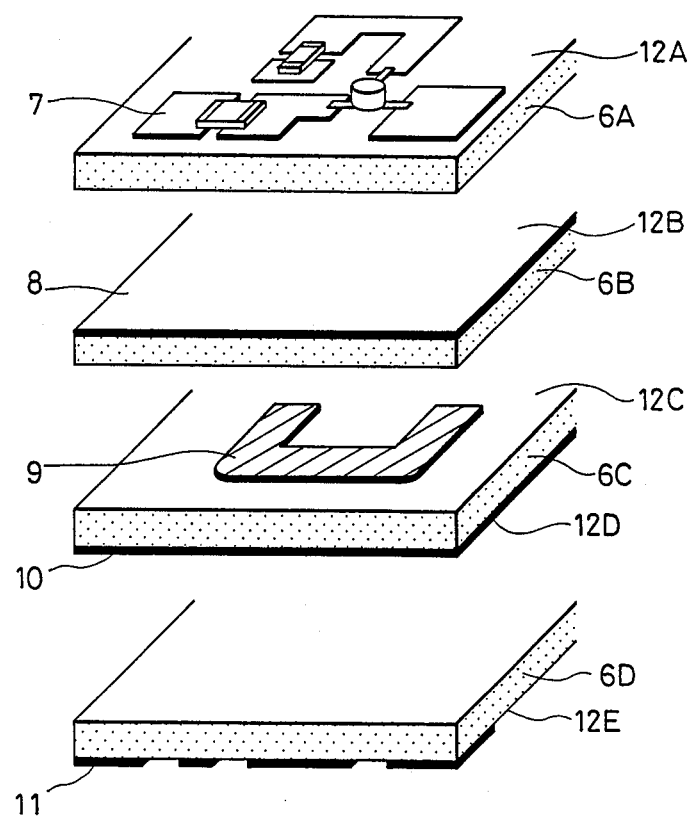
FIG. 2 is an exploded oblique view of the embodiment of FIG. 1.

FIG. 1 is an oblique partially cut-away view of a first embodiment of a high frequency circuit according to the present invention, while FIG. 2 is a corresponding exploded view to show the configurations of the various layers of the high frequency circuit structure. Reference numerals 6A, 6B, 6C and 6D denote respective ones of a set of four successively superimposed dielectric layers, each formed of an identical material having suitable dielectric properties such as glass epoxy. 12A, 12B, 12C, 12D and 12E indicate the positions of respective layers of electrically conducting material which were successively formed during the manufacturing process. Of these, layers 12A and 12E are metallic layers which are formed into respective circuit connection patterns 7 and 11 (i.e. patterns of connecting leads and component mounting pads), layer 12C is a metallic layer which has been patterned into the form of a short length of strip line 9, to function as a microstrip resonance element as described hereinafter, while the layers 12B and 12D have been left unpatterned and function as ground planes for the microstrip resonance element, each being connected to a common ground potential of the circuit connection patterns 7 and 11. Various components such as transistors, resistors etc. are mounted on the circuit connection patterns 7 and 11, to thereby form respective circuit sections 16 and 18.

A fifth layer of electrically conducting material 12E, e.g. consisting of solder for example, is shaped to form an outer shield 13, which is connected to the circuit ground potential. In this way, effective shielding against externally induced interference is provided, which achieves similar results to those provided by an external metal case of a conventional high frequency circuit.

The strip line 9 functions in conjunction with the dielectric layers 6B and 6C and the upper and lower ground plane layers 8 and 10 as a microstrip resonance element. For simplicity of description, the strip line 9 itself will be referred to hereinafter as a microstrip resonance element.

It will be apparent that, in addition to shielding the microstrip resonance element 9, the upper and lower ground plane layers also function as an effective shield between the upper and lower circuit sections 16 and 18. This is an extremely valuable feature, in many applications. If for example this embodiment is used to configure a high frequency oscillator circuit, then an oscillator circuit section can be implemented as circuit section 16 and coupled (e.g. by through-hole connection) to the microstrip resonance element 9, to thereby determine the frequency of oscillation, while a buffer output amplifier section can be implemented as circuit section 18 and coupled to receive and amplify an oscillator signal from the oscillator circuit section. In this case, the buffer amplifier section will be effectively shielded from the oscillator section, and from the microstrip resonance element 9, so that freedom from spurious oscillation is attained, together with greater stability of the frequency of oscillation with respect to load variations.

Figure 3:
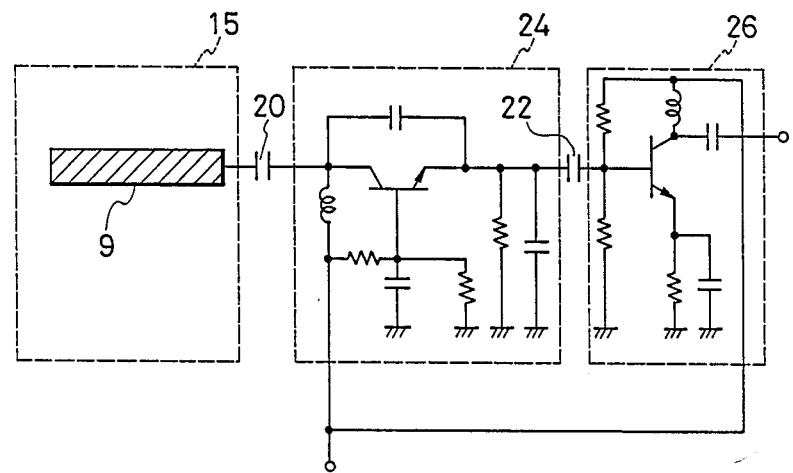
FIG. 3 is an electrical circuit diagram of the embodiment of FIG. 1.

FIG. 3 is a circuit diagram of such an oscillator circuit, in which the combination of the microstrip resonance element 9 with dielectric layers 6B and 6C and ground plane layers 8 and 10 is designated as a resonator section 15, an oscillator circuit section implemented as circuit section 16 is designated by numeral 24, and a buffer amplifier section implemented as circuit section 18 is designated by numeral 26. The microstrip resonance element 9 is coupled to the oscillator circuit section 24 by a coupling capacitor 20, while the oscillation signal produced from the oscillator circuit section 24 is coupled to the input of the buffer amplifier section 26 by a coupling capacitor 22. The oscillator circuit section 24 is basically a Colpitts type of oscillator circuit, in which the function of the conventional inductor in the feedback path is performed by the microstrip resonance element 9. More specifically, such a microstrip resonance element functions as an equivalent inductive reactance within a range of frequencies intermediate between its series resonant frequency and parallel resonance frequency. Thus in this embodiment, the microstrip resonance element 9 is utilized as an inductive element. The frequency stability of the oscillator circuit section 24 is essentially determined by the characteristics of the microstrip resonance element 9. Due to the effective shielding of the microstrip resonance element 9 by the upper and lower ground plane layers 8 and 10, freedom from spurious oscillation due to unwanted feedback to the microstrip resonance element 9 is prevented even if the overall size of the high frequency circuit is made extremely compact.

It will be apparent that the first embodiment described above could be equally utilized to implement various other types of high frequency circuit such as a filter circuit, with the microstrip resonance element serving as a band-pass filter element, for example. In this case, the input terminal and input circuit portion can be implemented in the upper circuit section 16, for example, and the output circuit portion and output terminal implemented in the lower circuit section 18. In this way, the input and output sides of the filter circuit are very effectively shielded due to the ground plane layers 8 and 10 which separate them.

The microstrip resonance element is of course not limited to being formed as a single strip line, but could equally well be formed of a plurality of strip lines, respectively configured to provide in combination a desired filter characteristic, as is well known in the art.

It can also be understood from the above that a high frequency circuit according to the first embodiment of the present invention can be made extremely compact, due to the effective shielding which is provided by the ground plane layers 8 and 10 between the microstrip resonance element and other circuit portions, and between the upper and lower circuit sections 16 and 18.

It should moreover be noted that the invention is not limited to the use of both an upper and a lower circuit section. It would be equally possible to utilize only three dielectric layers, with two of the dielectric layers (with respective ground plane layers formed thereon) sandwiching a strip line to form a microstrip resonance element, and with the third dielectric layer having a circuit pattern formed thereon. This would be equivalent to the configuration shown in FIG. 1, with the lowest dielectric layer 6D and the circuit section 18 omitted.

Figure 4:
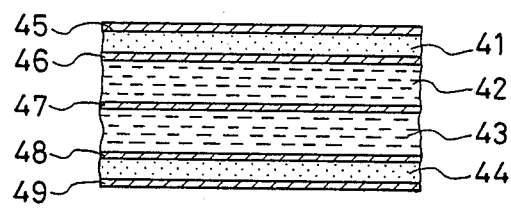
FIG. 4 is a partial cross-sectional view in elevation of a second embodiment of a high frequency circuit according to the present invention.

Referring now to FIG. 4, a second embodiment of the invention will be described, in which numerals 41 and 44 denote respective outer dielectric layers, 45 and 49 denote layers of electrically conducting material which are formed over an upper face of the dielectric layer 41 and a lower face of the dielectric layer 44, respectively, and are patterned to form electrical connecting lead patterns as in the first embodiment. 46 and 48 denote upper and lower ground plane layers respectively, and 42, 43 denote respectively dielectric layers disposed between the ground plane layers 46 and 48, which sandwich a layer of electrically conducting material that is patterned to form a microstrip resonance element, as in the first embodiment. Since the basic configuration of this embodiment is similar to that of the first embodiment, only the various layers are indicated in FIG. 4, and further description of these will be omitted. This embodiment differs from the first embodiment in that the two dielectric layers 42 and 43 are each formed of a material which provides a low degree of loss, with respect to operation of the microstrip resonance element. The embodiment further differs from the first embodiment in that the two dielectric layers 42 and 43 are each made of appropriate thickness to provide desired operating characteristics for the microstrip resonance element. For this reason, each of the dielectric layers 42 and 43 is made substantially thicker than each of the outer dielectric layers 41 and 44, for which a higher level of loss is permissible. With this second embodiment, since the outer dielectric layers 41 and 44 can be designed without taking into consideration the operation of the microstrip resonance element, these dielectric layers can be made as thin as practicable, and can be formed of the most suitable material. As a result, the overall circuit size can be made extremely compact, while ensuring low-loss operation and hence a high Q-factor for the microstrip resonance element.

Although in the second embodiment described above both of the dielectric layers 42 and 43 are made of increased thickness, relative to the outer dielectric layers 41 and 44, it should be noted that in some cases it may be possible to make only one of these dielectric layers 42 and 43 of increased thickness, i.e. making all of the remaining dielectric layers of substantially identical thickness.

Furthermore although in the second embodiment described above both of the dielectric layers 42 and 43 are made of a low-loss dielectric material, it should be noted that in some cases it may be possible to make only one of these dielectric layers 42 and 43 of such a special dielectric material, i.e. forming all of the remaining dielectric layers from identical material which does not have low-loss properties.

Figure 5A:
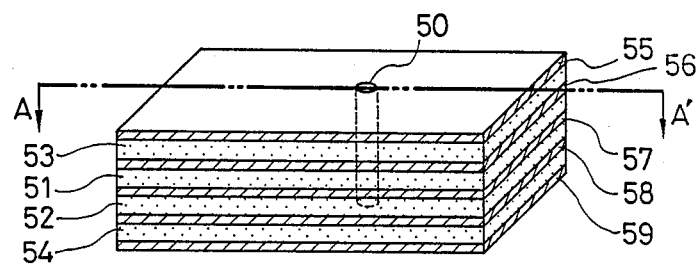
FIG. 5(a) is an oblique view of a third embodiment of a high frequency circuit according to the present invention.
Figure 5B:
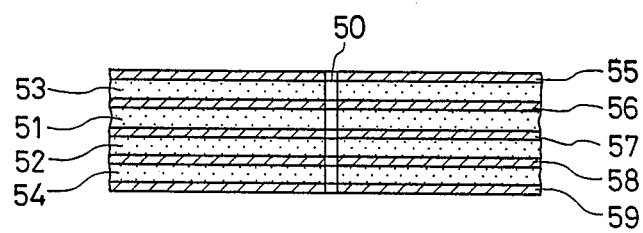
FIG. 5(b) is a cross-sectional view in elevation of the embodiment of FIG. 5(a)

FIG. 5(a) is an oblique view of a third embodiment f the present invention, while FIG. 5(b) is a partial cross-sectional view in elevation of this embodiment, taken along line A-A' in FIG. 5(a). This embodiment is a high frequency circuit having a multi-layer substrate, as for the first embodiment of FIG. 1, with numerals 51, 52, 53 and 54 denoting respective dielectric layers, and 55, 56, 57, 58 and 59 denoting respective layers of electrically conducting material. Layers 56 and 58 are ground plane layers, between which are sandwiched the dielectric layers 51 and 52, with the conductive layer 57 formed therebetween being patterned into a microstrip resonance element as in the first embodiment, and with respective circuit connection patterns being formed by the outer layers 55 and 59. In these respects this embodiment is identical to that of FIG. 1, and has upper and lower circuit sections formed on the upper and lower external faces as for the first embodiment. For this reason, only the positions of the various layers are indicated in FIGS. 5(a), 5(b), and further description of the layer configurations will be omitted.

This embodiment differs from the previous embodiments in the formation of an elongated (as viewed in a direction perpendicular to the substrate plane) aperture 50, i.e. a slit which penetrates substantially vertically through all of the layers described above. Incorporation of the slit 50 enables a further degree of isolation to be attained between circuit portions which must be mutually isolated, by enabling such portions to be mutually physically separated.

If for example this embodiment is utilized to form a high frequency oscillator circuit of the form shown in FIG. 3 and described hereinabove, then it becomes possible to position the resonator 9 and the oscillator circuit section 24 at one laterally extending side of the slit 50 (i.e. both positioned at the right side or left side as viewed in FIG. 5(b)) and to position the buffer amplifier circuit section 26 at the opposite side of the slit 50. In this way an enhanced degree of separation is attained between the output portion of the buffer amplifier circuit section 26 and the oscillator circuit components, in addition to the shielding described above which is provided by the ground plane layers 56, 58. Thus, freedom from spurious oscillation effects and enhanced operating stability are ensured.

If the embodiment of FIGS. 5(a), 5(b) is utilized to form a high frequency filter circuit, then it becomes possible to position an input terminal of the filter circuit at one side of the slit 50, for example formed in the upper layer 55 at the right side of slit 50 (as viewed in FIG. 5(b)), and to position the output terminal of the filter circuit (formed in layer 59) at the opposite side, i.e. to the left of the slit 50 as viewed in FIG. 5(b). In this way, in addition to the shielding described above which is provided by the ground plane layers 56, 58 as described above, physical separation between the input and output terminals of the filter is achieved. Unwanted coupling between the input and output portions of the filter circuit can thereby be more effectively reduced, enabling the design performance of the filter to be fully realized.

Figure 6:
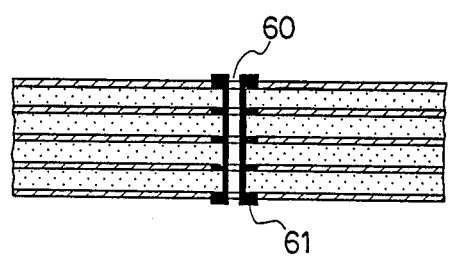
FIG. 6 is a cross-sectional view of a modification of the embodiment of FIGS. 5(a), 5(b).

FIG. 6 is a partial cross-sectional view in elevation corresponding to that of FIG. 5(b) of another embodiment of the present invention, which is a modification of the embodiment of FIGS. 5(a), 5(b). This differs from the latter embodiment in that a slit 60 is formed in the same manner as the slit 50, but has a layer of electrically conducting material 61, e.g. a metallic layer, formed to extend over the surface of the slit in the same manner as a conventional through-hole connecting aperture. This layer 61 is connected to each of the ground plane layers 57, 58, i.e. to the circuit ground potential, to thereby function as a shield and hence provide enhancement of the isolation effects described above with reference to FIGS. 5(a) and 5(b).

From the above description of embodiments of the invention, it will be understood that the present invention enables a high frequency circuit having a multi-layer substrate structure which includes a microstrip resonance element to be made extremely compact in size, while ensuring that excellent high frequency performance can be achieved, in spite of the very close mutual proximity of various circuit components.

What is claimed is:
1. A high frequency circuit comprising:
   at least first, second and third successively superimposed dielectric layers;
   a microstrip resonance element formed of a layer of electrically conducting material, sandwiched between said first and second dielectric layers;
   a first ground plane layer comprising a layer of electrically conducting material formed below said first dielectric layer and connected to a circuit ground potential;

a second ground plane layer comprising a layer of electrically conducting material formed sandwiched between said second and third dielectric layers and connected to said ground potential; and a circuit section comprising a circuit connection pattern formed of a layer of electrically conducting material disposed upon an upper face of said third dielectric layer and a plurality of circuit components mounted upon said circuit connection pattern.

2. A high frequency circuit according to claim 1, in which at least one of said first and second dielectric layers is of greater thickness than said third dielectric layer.

3. A high frequency circuit according to claim 1, in which at least one of said first and second dielectric layers is formed of a material exhibiting a lower degree of electrical loss under high frequency operation than a material forming said third dielectric layer.

4. A high frequency circuit according to claim 1, 2 or 3, and further comprising a through-aperture in the form of a slit, formed extending through all of said layers along a direction substantially perpendicular to the plane of each of said layers.

5. A high frequency circuit according to claim 4, and further comprising a layer of electrically conducting material formed over a surface of said slit and connected to said circuit ground potential.

6. A high frequency circuit according to claim 1, and further comprising a fourth dielectric layer disposed below said first dielectric layer to sandwich said first ground plane layer between said first and fourth dielectric layers, and a second circuit section comprising a second circuit connection pattern formed of a layer of electrically conducting material disposed upon a lower face of said fourth dielectric layer and a plurality of circuit components mounted upon said second circuit connection pattern.

7. A high frequency circuit comprising:

first, second, third and fourth successively superimposed layers of dielectric material;

a microstrip resonance element formed of a layer of electrically conducting material, sandwiched between said second and third dielectric layers;

a first ground plane layer comprising a layer of electrically conducting material sandwiched between said first and second dielectric layers and connected to a circuit ground potential;

a second ground plane layer comprising a layer of electrically conducting material formed sandwiched between said third and fourth dielectric layers and connected to said circuit ground potential;

a first circuit section comprising a first circuit connection pattern formed of a layer of electrically conducting material disposed upon an upper face of said fourth dielectric layer and a plurality of circuit components mounted upon said first circuit connection pattern and;

a second circuit section comprising a second circuit connection pattern formed of a layer of electrically conducting material disposed upon a lower face of said first dielectric layer and a plurality of circuit components mounted upon said second circuit connection pattern.

8. A high frequency circuit according to claim 7, and further comprising a through-aperture in the form of a slit, formed extending through all of said layers.

9. A high frequency circuit according to claim 7, and further comprising a layer of electrically conducting material formed over a surface of said slit and connected to said circuit ground potential.

10. A high frequency circuit according to claim 8 or 9, in which respective portions of said first and second circuit sections which are required to be mutually electrically isolated are respectively positioned on mutually opposite sides of said slit.

11. A high frequency circuit according to claim 1 in which said high frequency circuit is a high frequency oscillator circuit, and in which said first circuit section comprises an oscillator circuit section which is connected to said microstrip resonance element, and said second circuit section comprises a buffer circuit section which is coupled to receive an oscillator signal from said oscillator signal and produce an output signal, and in which said oscillator circuit section and said buffer circuit section are respectively positioned at mutually opposite laterally extending sides of said slit.

12. A high frequency circuit according to claim 10, in which said high frequency circuit is a filter circuit, and in which an input terminal of said filter circuit is formed in said first section, positioned at one laterally extending side of said slit and an output terminal of said filter circuit is formed in said second circuit section, positioned at the opposite side of said slit from said input terminal.

* * * * *